US011222695B2

(12) United States Patent
Majumdar et al.

(10) Patent No.: US 11,222,695 B2
(45) Date of Patent: Jan. 11, 2022

(54) SOCKET DESIGN FOR A MEMORY DEVICE

(71) Applicant: Micron Technology, Inc., Boise, ID (US)

(72) Inventors: Amitava Majumdar, Boise, ID (US); Radhakrishna Kotti, Boise, ID (US); Rajasekhar Venigalla, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/685,349

(22) Filed: Nov. 15, 2019

(65) Prior Publication Data

US 2021/0151105 A1    May 20, 2021

(51) Int. Cl.
| | | |
|---|---|---|
| *G11C 5/02* | (2006.01) | |
| *G11C 13/00* | (2006.01) | |
| *H01L 23/528* | (2006.01) | |
| *H01L 23/522* | (2006.01) | |
| *H01L 27/24* | (2006.01) | |
| *H01L 45/00* | (2006.01) | |

(52) U.S. Cl.
CPC ........ *G11C 13/0028* (2013.01); *G11C 13/004* (2013.01); *G11C 13/0004* (2013.01); *G11C 13/0026* (2013.01); *G11C 13/0069* (2013.01); *H01L 23/528* (2013.01); *H01L 23/5226* (2013.01); *H01L 27/2481* (2013.01); *H01L 45/06* (2013.01); *H01L 45/1233* (2013.01); *G11C 2213/52* (2013.01); *G11C 2213/71* (2013.01); *H01L 45/1253* (2013.01); *H01L 45/143* (2013.01)

(58) Field of Classification Search
CPC .......... G11C 5/025; G11C 5/04; G11C 5/063; G11C 11/4097; G11C 7/18
USPC ..................................... 365/51, 63
See application file for complete search history.

(56) References Cited

U.S. PATENT DOCUMENTS

| | | |
|---|---|---|
| 10,074,693 B2 | 9/2018 | Castro |
| 2006/0209585 A1 | 9/2006 | Tanizaki et al. |
| 2010/0332729 A1 | 12/2010 | Alrod et al. |

(Continued)

OTHER PUBLICATIONS

ISA/KR, International Search Report and Written Opinion of the International Searching Authority, Int'l Appl. No. PCT/US2020/058805, Feb. 22, 2021, Korean Intellectual Property Office, Seo-gu, Daejeon, Republic of Korea, 13 pgs.

(Continued)

*Primary Examiner* — Son T Dinh
(74) *Attorney, Agent, or Firm* — Holland & Hart LLP

(57) ABSTRACT

Methods, systems, and devices supporting a socket design for a memory device are described. A die may include one or more memory arrays, which each may include any number of word lines and any number of bit lines. The word lines and the bit lines may be oriented in different directions, and memory cells may be located at the intersections of word lines and bit lines. Sockets may couple the word lines and bit lines to associated drivers, and the sockets may be located such that memory cells farther from a corresponding word line socket are nearer a corresponding bit line socket, and vice versa. For example, sockets may be disposed in rows or regions that are parallel to one another, and which may be non-orthogonal to the corresponding word lines and bit lines.

29 Claims, 6 Drawing Sheets

(56) References Cited

U.S. PATENT DOCUMENTS

| | | | |
|---|---|---|---|
| 2014/0104938 A1* | 4/2014 | Castro | H01L 27/2436 |
| | | | 365/163 |
| 2016/0133320 A1 | 5/2016 | Siau et al. | |
| 2016/0211035 A1 | 7/2016 | Shapira et al. | |
| 2016/0315120 A1* | 10/2016 | Sumino | H01L 23/528 |
| 2016/0351233 A1 | 12/2016 | Castro et al. | |
| 2019/0088288 A1 | 3/2019 | Tatsumura et al. | |

OTHER PUBLICATIONS

Taiwan Intellectual Property Office, "Office Action," issued in connection with ROC (Taiwan) Patent Application No. 109137040, dated Jul. 14, 2021 (24 pages with Translation).

* cited by examiner

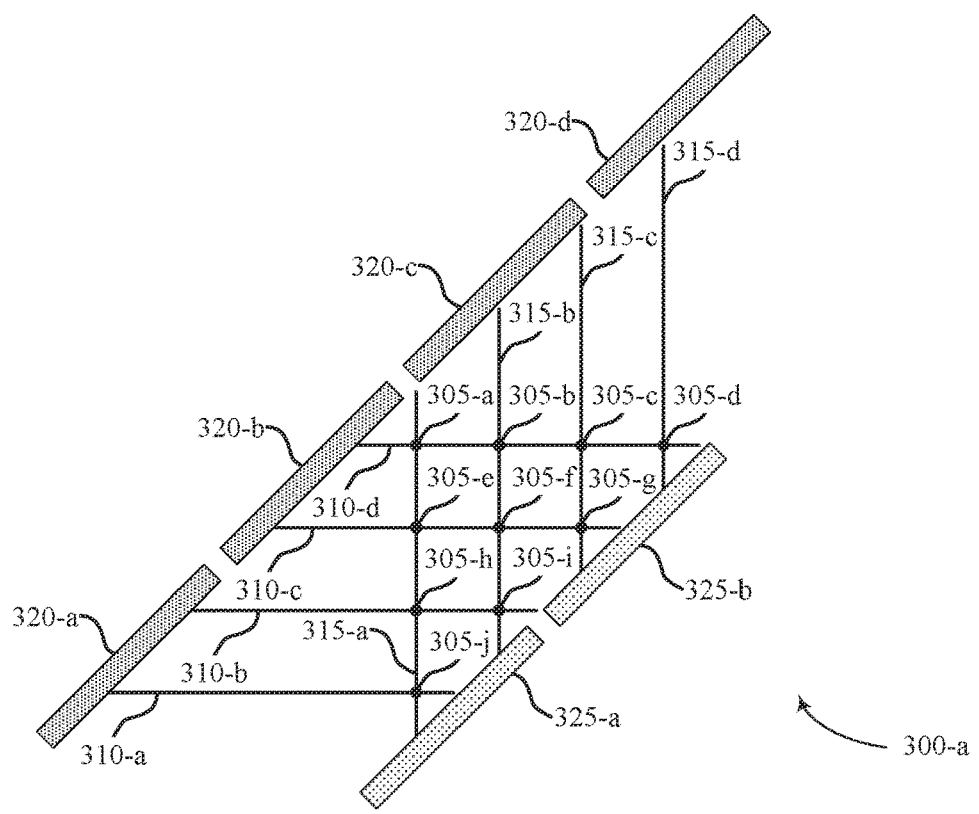
FIG. 3A
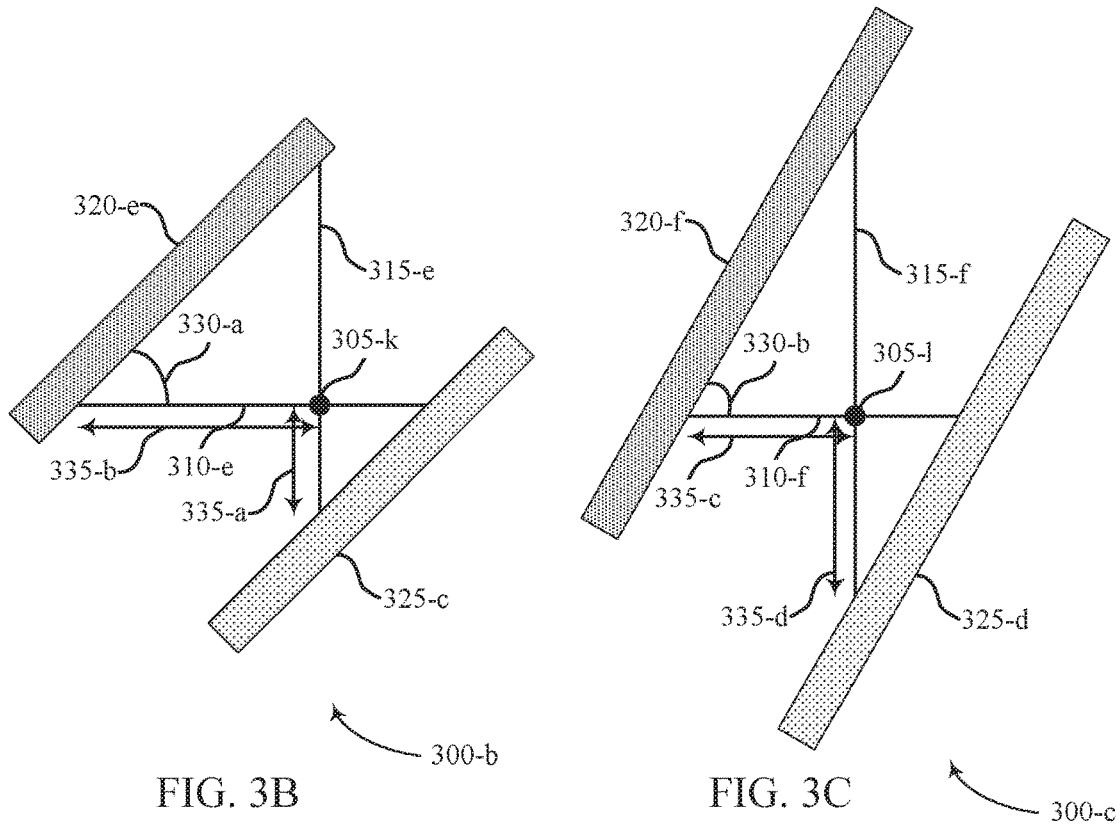
FIG. 3B
FIG. 3C

SOCKET DESIGN FOR A MEMORY DEVICE

BACKGROUND

The following relates generally to a system that includes at least one memory device and more specifically to a socket design for a memory device.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

Improving memory devices, generally, may include increasing memory cell density, increasing read/write speeds, increasing reliability, increasing data retention, reducing power consumption, decreasing stress on a memory cell or other components of memory devices, or reducing manufacturing costs, among other metrics.

BRIEF DESCRIPTION OF THE DRAWINGS

FIGS. 3A through 3C illustrate examples of socket designs for cross-point memory in accordance with examples as disclosed herein.

DETAILED DESCRIPTION

Figure 1:
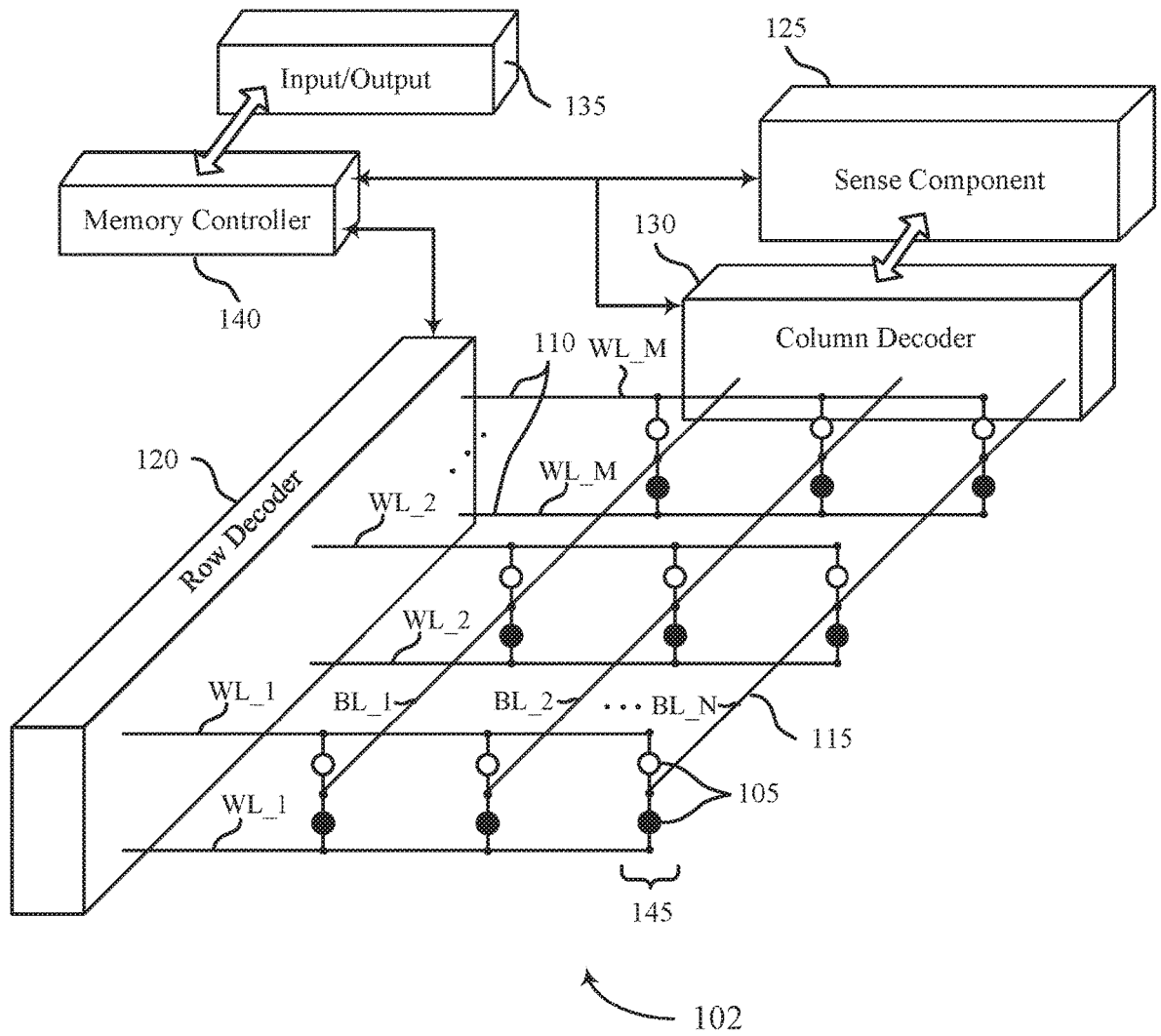
FIG. 1 illustrates an example memory device that supports a socket design for a memory device in accordance with examples as disclosed herein.

In some cases, a memory device (e.g., a cross-point memory device) may be configured to access a memory cell and sense a logic state stored in the memory cell, in accordance with aspects of the present disclosure. The access may occur as part of a read operation, a write operation, or a combination thereof. Memory cells in the memory array may be arranged into columns and rows where each row of memory cells corresponds to (e.g., is coupled with) a same word line, and each column of memory cells corresponds to (e.g., is coupled with) a same bit line. Bit lines and word lines of the memory device may be non-parallel (e.g., orthogonal) to one another, and each memory cell in the memory array may be located at an intersection of a word line and a bit line.

In some memory architectures, accessing a memory cell during a read or write operation may include applying a non-zero voltage across the memory cell in order to read (e.g., sense) a logic state stored by the memory cell. Accessing the memory cell thus may include selecting a bit line and a word line coupled with the memory cell by applying respective voltages to the bit line and the word line. Bit lines and word lines (either or both of which may be referred to as access lines) may be coupled with respective sockets, which may in turn be coupled with respective drivers configured to apply a current and a voltage to the word lines and bit lines as part of the access operation. For example, each socket may be coupled with a via, and the via may be coupled with the driver for the socket and associated bit line or word line. Vias may extend in a different direction than the bit lines and words lines (e.g., vias may extend through layers or decks of a memory device, which may be referred to as a vertical direction for clarity, whereas bit lines and word lines may extend horizontally within respective layers or decks of the memory device). In some examples, sockets may be disposed in rows, and an area of the memory device that includes one or socket rows may be referred to as a socket region. In general, a socket region may be defined as a region (e.g., of a memory die) where access lines terminate into (e.g., are coupled with) vias that carry signals to and from the access lines.

A memory device may be configured to apply a voltage $V_{cell}$ across a memory cell as part of an access operation. For example, the voltage $V_{cell}$ may represent a threshold voltage for sensing the logic state stored by the memory cell. The memory device may configure the drivers to select the word line and the bit line coupled with the memory cell by applying a current I and a voltage $V_{source}$. The voltage $V_{source}$ may be determined or otherwise configured based on the voltage $V_{cell}$, as well as a resistance $R_{WL}$ associated with the word line and a resistance $R_{BL}$ associated with the bit line. For example, the voltage $V_{source}$ may be determined such that $V_{cell}=V_{source}-I \cdot (R_{WL}+R_{BL})$, where the resistance of vias or other interconnect structures between the source and the memory cell may be considered negligible compared to $R_{WL}$ and $R_{BL}$. Further, the resistances associated with the word line and the bit line may be functions of the respective lengths of the word line and the bit line. Specifically, the resistance $R_{WL}$ and the resistance $R_{BL}$ may be defined as $R_{WL}=\rho L_{WL}$ and $R_{BL}=\rho L_{BL}$, where $L_{WL}$ represents a length of the word line from the word line socket to the memory cell, $L_{BL}$ represents a length of the bit line from the bit line socket to the memory cell, and $\rho$ represents a resistivity (i.e., a resistance per unit length) of the word line and the bit line. In some examples, the word line and the bit line may have the same resistivity (e.g., when the word line and the bit line are composed of the same material). In some other examples, the word line and the bit line may be composed of different materials, or may have different cross-sectional areas (e.g., different widths and/or thicknesses) or other variations, and the word line and the bit line each have different resistivities $\rho$.

A memory cell may have an associated electrical distance (ED) based on the corresponding resistance $R_{WL}$, and resistance $R_{BL}$. The ED associated with the memory cell may, for example, be expressed as a sum of a first quantity of lines and spaces between the memory cell and the word line socket, and a second quantity of lines and spaces between the memory cell and the bit line socket. For example, a memory cell that is located one thousand lines (and spaces between the lines) from the word line socket and five hundred lines from the bit line socket may have an associated ED of 1500, which may be expressed as 1.5 K ED. Accordingly, a first memory cell (which may be referred to as a near-near memory cell) that is physically located near a word line socket and near a bit line socket may have a smaller ED than a second memory cell (which may be referred to as a far-far memory cell) that is physically located further from a word line socket and further from a bit line socket.

Variations in ED associated with memory cells in a memory array may negatively impact performance and design optimization of the memory device. For example, accessing a far-far memory cell may require a relatively large amount of drive current, which may impact driver designs or other design considerations along with power consumption and other performance aspects. Accessing a near-near memory cell may result in a large amount of discharge current (e.g., a current spike) when the memory cell is activated (e.g., when $V_{cell}$ reaches the threshold voltage of the cell), due to charge build up in associated parasitic capacitances and the relatively low values of the corresponding $R_{WL}$ and $R_{BL}$, which may increase wearout of near-near memory cells unless reduced drive currents or other mitigation techniques are used for near-near memory cells.

Some memory devices may attempt to compensate for variations in ED across memory cells by adjusting driver operation based on memory cell location (e.g., based on increasing the driver current for far-far memory cells and decreasing the driver current for near-near memory cells, such as by adjusting $V_{source}$), but use of such an algorithm or scheme may introduce operational complexity or latency (e.g., to execute the algorithm and adjust drivers based on the algorithm). Further, some such techniques may rely on mapping tables of memory cell addresses to associated EDs or drive currents, which may occupy storage that could otherwise be used to store other data.

As described herein, it may be beneficial to reduce variation in ED across the memory cells of a memory device and thereby improve performance and efficiency of the memory device through structural features of the memory device. For example, the rows of bit line sockets and the rows of word line sockets (and thus the associated socket regions) may be slanted (tilted) relative to the word lines or bit line such that the rows of sockets extend in a direction that is skew (i.e., not orthogonal) to the word lines or the bit lines. In some cases, the rows of bit line sockets and the rows of word line sockets may be parallel to one another.

In some examples, such as when the resistivity ρ is the same for the word lines and the bit lines, the rows of sockets may extend in a direction that is tilted 45° relative to the direction of the word lines and the direction of the bit lines. In some examples, such as when the resistivity $\rho_W$ of the word lines is different than the resistivity $\rho_B$ of the bit lines, the rows of sockets may extend in a direction that is tilted at an angle relative to the direction of the bit lines (and tilted at a complementary angle relative to the direction of the word lines), where the angle is based on the resistivity $\rho_W$ of the word lines and the resistivity $\rho_B$ of the bit lines. For example, a reference angle θ may be defined relative to the direction of the bit lines and determined according to the equation tan θ=$\rho_B$/$\rho_W$, though one of ordinary skill in the art will appreciate that a like reference angle may alternatively be defined relative to the direction of the word lines.

Features of the disclosure are initially described in the context of a memory system and memory die as described with reference to FIGS. 1 and 2. Features of the disclosure are then described in the context of socket designs, a die layout, and a socket region as described with reference to FIGS. 3-5. These and other features of the disclosure are further illustrated by and described with reference to a flowchart that relates to a socket design for a memory device as described with reference to FIG. 6.

FIG. 1 illustrates an example memory device 100 that supports a socket design for a memory device in accordance with examples as disclosed herein. Memory device 100 may also be referred to as an electronic memory apparatus. FIG. 1 is an illustrative representation of various components and features of the memory device 100. As such, it should be appreciated that the components and features of the memory device 100 are shown to illustrate functional interrelationships, and not necessarily actual physical positions within the memory device 100. In the illustrative example of FIG. 1, the memory device 100 includes a three-dimensional (3D) memory array 102. The 3D memory array 102 includes memory cells 105 that may be programmable to store different states. In some examples, each memory cell 105 may be programmable to store one of two states, denoted as a logic 0 and a logic 1. In some examples, a memory cell 105 may be configured to store one of more than two logic states. Although some elements included in FIG. 1 are labeled with a numeric indicator, other corresponding elements are not labeled, though they are the same or would be understood to be similar, in an effort to increase visibility and clarity of the depicted features.

The 3D memory array 102 may include two or more two-dimensional (2D) memory arrays formed on top of one another. This may increase a number of memory cells that may be placed or created on a single die or substrate as compared with 2D arrays, which in turn may reduce production costs, or increase the performance of the memory device, or both. The memory array 102 may include two levels of memory cells 105 and may thus be considered a 3D memory array; however, the number of levels is not limited to two and may in some cases be one or more than two. Each level may be aligned or positioned so that memory cells 105 may be aligned (exactly, overlapping, or approximately) with one another across each level, forming a memory cell stack 145. In some cases, the memory cell stack 145 may include multiple memory cells 105 laid on top of another while sharing an access line. The memory cells 105 may in some cases be configured to each store one bit of data.

A memory cell 105 may, in some examples, be a self-selecting memory cell, a phase change memory (PCM) cell, and/or another type of resistive or threshold-based memory cell. A self-selecting memory cell 105 may include one or more components of a material (e.g., a chalcogenide material) that each function both as a storage element and as a cell selector (selection) element, thereby eliminating the need for separate cell selector circuitry selector circuitry that does not contribute to storage). Such an element may be referred to as a storage and selector component (or element), or as a self-selecting memory component (or element). In contrast, other types of memory cells, such as dynamic random access memory (DRAM) or PCM cells, may each include a separate (dedicated) cell selector element such as a three-terminal selector element (e.g., a transistor) to contribute to the selection or non-selection of the memory cell without contributing to the storage of any logic state.

Memory array 102 may include multiple word lines 110 (e.g., row lines) for each deck, labeled WL_1 through WL_M, and multiple bit lines 115 (e.g., column lines), labeled BL_1 through BL_N, where M and N depend on the array size. In some examples, each row of memory cells 105 is connected to a word line 110, and each column of memory cells 105 is connected to a bit line 115. In some cases, word lines 110 and bit lines 115 may generically be referred to as access lines because they may permit access to memory cells 105. In some examples, bit lines 115 may also be known as digit lines 115. References to access lines, word lines, and bit lines, or their analogues, are interchangeable without loss of understanding or operation. Activating or selecting a word line 110 or a bit line 115 may include applying a voltage to the respective line. Word lines 110 and bit lines 115 may be made of conductive materials such as metals (e.g., copper (Cu), aluminum (Al), gold (Au), tungsten (W), titanium (Ti)), metal alloys, carbon, conductively doped semiconductors, or other conductive materials, alloys, compounds, or the like.

Word lines 110 and bit lines 115 may be substantially perpendicular (i.e., orthogonal) to one another or otherwise intersect one another to create an array of memory cells. As shown in FIG. 1, the two memory cells 105 in a memory cell stack 145 may share a common conductive line such as a bit line 115. That is, a bit line 115 may be in electronic communication with the bottom electrode of the upper memory cell 105 and the top electrode of the lower memory cell 105. Other configurations may be possible, for example, a third layer may share an access line 110 with a lower layer. In general, one memory cell 105 may be located at the intersection of two conductive lines such as a word line 110 and a bit line 115. This intersection may be referred to as an address of a memory cell 105. A target memory cell 105 may be a memory cell 105 located at the intersection of an energized word line 110 and bit line 115; that is, word line 110 and bit line 115 may be energized to read or write a memory cell 105 at their intersection. Other memory cells 105 that are in electronic communication with (e.g., connected to) the same word line 110 or bit line 115 may be referred to as untargeted memory cells 105.

Electrodes may be coupled to a memory cell 105 and a word line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory device 100. In some examples, a memory cell 105 may include multiple self-selecting or other memory components (e.g., a selection component and a storage component) separated from each other and from access lines 110, 115 by electrodes. As previously noted, for self-selecting memory cells 105, a single component (e.g., a section or layer of chalcogenide material within the memory cell 105) may be used as both a storage element (e.g., to store or contribute to the storage of a state of memory cell 105) and as a selector element (e.g., to select or contribute to the selection of the memory cell 105).

The electrodes within a memory cell stack 145 may each be of a same material (e.g., carbon) or may be of various (different) materials. In some cases, the electrodes may be a different material than the access lines. In some examples, the electrodes may shield a material (e.g., a chalcogenide material) included in a self-selecting or other memory component from the word line 110, from the bit line 115, and from each other to prevent chemical interaction between the material and the word line 110, the bit line 115, or another memory component.

Operations such as reading and writing may be performed on memory cells 105 by activating or selecting a corresponding word line 110 and bit line 115. Accessing memory cells 105 may be controlled through a row decoder 120 and a column decoder 130. For example, a row decoder 120 may receive a row address from the memory controller 140 and activate the appropriate word line 110 based on the received row address. Such a process may be referred to as decoding a row or word line address. Similarly, a column decoder 130 may receive a column address from the memory controller 140 and activate the appropriate bit line 115. Such a process may be referred to as decoding a column or bit line address. A row decoder 120 and/or column decoder 130 may be examples of decoders implemented using decoder circuitry, for example. In some cases, row decoder 120 and/or column decoder 130 may include charge pump circuitry that is configured to increase a voltage applied to a word line 110 or bit line 115 (respectively).

A memory cell 105 may be read (e.g., sensed) by a sense component 125 when the memory cell 105 is accessed (e.g., in cooperation with the memory controller 140, row decoder 120, and/or column decoder 130) to determine a logic state stored by the memory cell 105. The sense component 125 may provide an output signal indicative of (e.g., based at least in part on) the logic state stored by the memory cell 105 to one or more components (e.g., to the column decoder 130, the input/output component 135, the memory controller 140). In some examples, the detected logic state may be provided to a host device (e.g., a device that uses the memory device 100 for data storage, a processor coupled with the memory device 100 in an embedded application), where such signaling may be provided directly from the input/output component 135 or via the memory controller 140.

Sense component 125 may include various transistors or amplifiers to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. An ordinary person skilled in the art would appreciate that sense component may be associated either with column decoder or row decoder without losing its functional purpose.

In some memory architectures, accessing a memory cell 105 may degrade or destroy a logic state stored by one or more memory cells 105, and rewrite or refresh operations may be performed to return the original logic state to the memory cells 105. In architectures that include a material portion for logic storage, for example, sense operations may cause a change in the atomic configuration or distribution of a memory cell 105, thereby changing the resistance or threshold characteristics of the memory cell 105. Thus, in some examples, the logic state stored in a memory cell 105 may be rewritten after an access operation.

In some examples, reading a memory cell 105 may be non-destructive. That is, the logic state of the memory cell 105 may not need to be rewritten after the memory cell 105 is read. For example, in architectures that include a material portion for logic storage, sensing the memory cell 105 may not destroy the logic state and, thus, a memory cell 105 may not need rewriting after accessing. However, in some examples, refreshing the logic state of the memory cell 105 may or may not be needed in the absence or presence of other access operations. For example, the logic state stored by a memory cell 105 may be refreshed at periodic intervals by applying an appropriate write or refresh pulse or bias to maintain stored logic states. Refreshing a memory cell 105 may reduce or eliminate read disturb errors or logic state corruption.

Though illustrated to the side of the memory array 102 for clarity, the row decoder 120 and column decoder 130 may in some cases be below the memory array 102. Each decoder 120, 130 may include or be coupled with one or more drivers configured to drive the access lines 110, 115 to desired voltages (e.g., to access one or more associated memory cells 105). In some cases, the drivers may be distributed throughout an area under the memory array 102. Vias may extend through one or more layers or decks of the memory device 100 to couple the drivers with their corresponding access lines 110, 115. For example, if the access lines 110, 115 are considered to extend in horizontal directions (e.g., an x direction or a y direction), vias may extend in a vertical (z) direction. In some cases, one or more layers between the drivers and the access lines may include metal routing lines, which may be referred to as interconnect layers or collectively as an interconnect layer, where drivers may be coupled with corresponding lines in the interconnect layer and vias may extend between the interconnect layer and the layers that include the access lines 115.

The word lines 110 may be coupled with the row decoder 120 via one or more rows of word line sockets (not shown), and the bit lines 115 may be coupled with the column decoder 130 via one or more rows of bit line sockets (not shown). For example, each socket may be coupled with a corresponding via or other interconnect structure and thereby serve to couple the corresponding access lines 110, 115 with the corresponding decoder 120, 130 with a driver included in or coupled with the corresponding decoder 120, 130). As described herein, the word line sockets and the bit line sockets may be located such that a same ED is associated with each memory cell 105 in the memory array 102, or that variations in ED are otherwise reduced. This may be achieved by tilting the rows of bit line sockets and the rows of word line sockets such that the rows of sockets extend in a direction that is skew (i.e., not orthogonal) to the word lines 110 or the bit lines 115. In some cases, the rows of bit line sockets may be parallel to the rows of word line sockets.

Because each memory cell 105 has the same or similar associated ED, the memory device 100 may apply a same or similar voltage $V_{source}$ and thus a same or similar drive current I (e.g., via the memory controller 140) to achieve a same or similar voltage drop $V_{cell}$ across any memory cell 105 in the memory array 102. This may enable the memory device to provide sufficient drive current while avoiding large amounts of current discharge across memory cells 105 due to parasitic capacitance of the word lines 110 or the bit lines 115, which may improve performance and increase the lifetimes of the memory cells 105, regardless of their physical location in the memory array 102. Additionally, the memory device 100 may avoid a need to dynamically vary the voltage $V_{source}$ and current I for different memory cells 105 at different physical locations, which may reduce a signaling overhead or other complexities along with latencies associated with access operations, and which may support various design optimizations.

Figure 2:
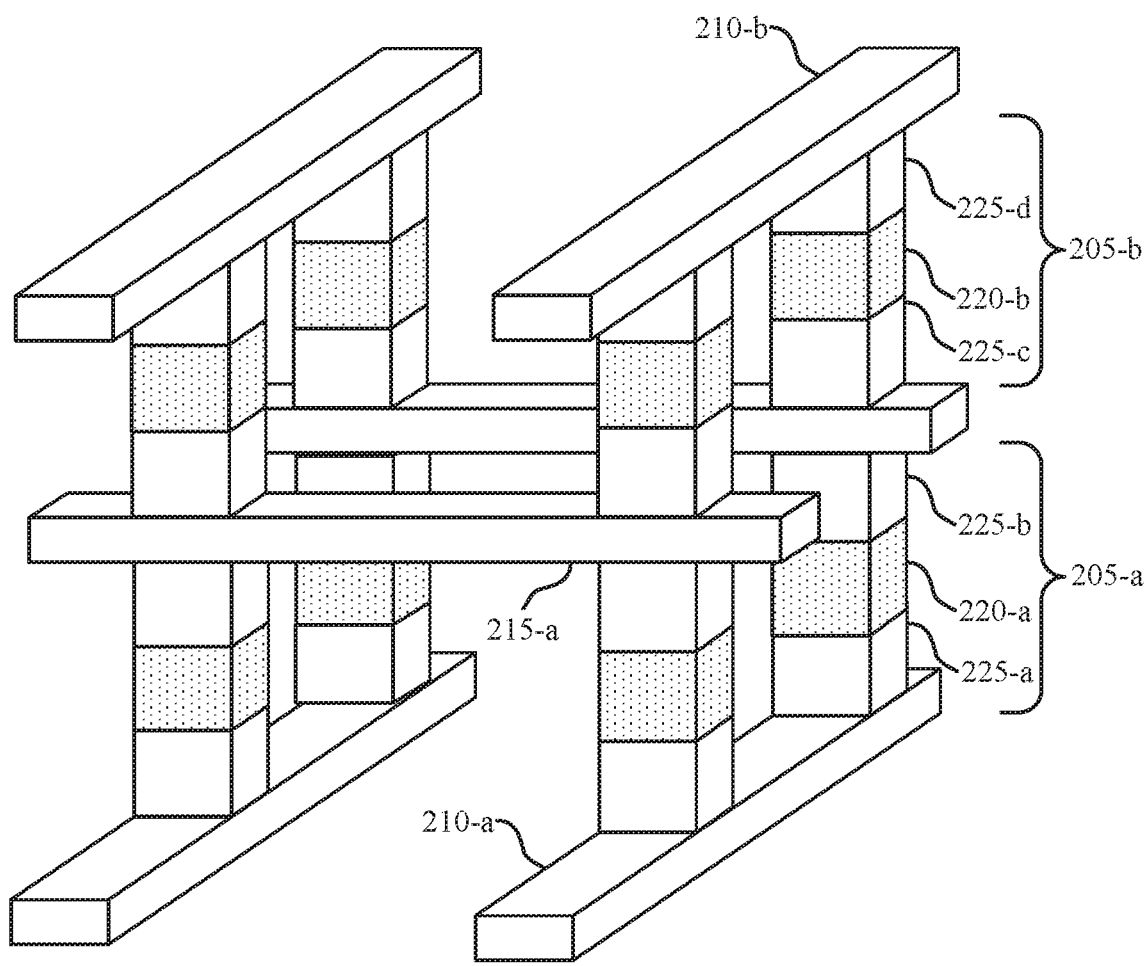
FIG. 2 illustrates an example of a memory array that supports a socket design for a memory device in accordance with examples as disclosed herein.
Figure 2:
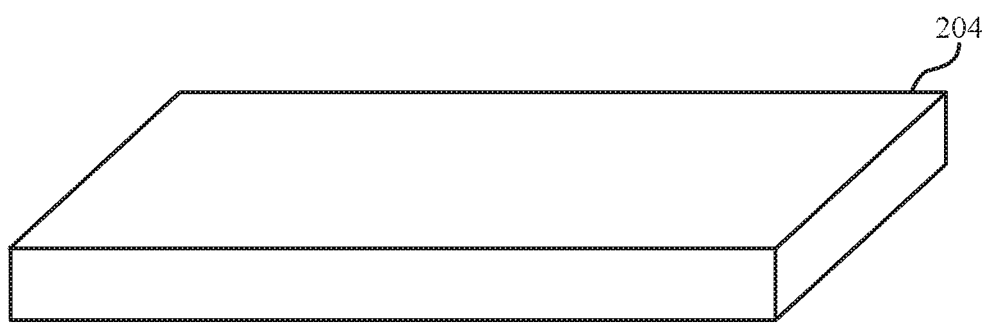

FIG. 2 illustrates an example of a 3D memory array 200 that supports a socket design for a memory device in accordance with examples as disclosed herein. The memory array 200 may be an example of portions of a memory array 102 described with reference to FIG. 1. The memory array 200 may include a first array or deck 205-a of memory cells that is positioned above a substrate 204 and second array or deck 205-b of memory cells on top of the first array or deck 205-a. Though the example of the memory array 200 includes two decks 205-a, 205-b, it is to be understood that one deck (e.g., a 2D memory array) or more than two decks are also possible.

The memory array 200 may also include word line 210-a and word line 210-b, and bit line 215-a, which may be examples of word line 110 and bit line 115, as described with reference to FIG. 1. The word lines 210 may be coupled with one or more rows of word line sockets (not shown), and the bit lines 215 may be coupled with one or more rows of bit line sockets (not shown). Though one memory element 220 per memory cell is shown for the sake of clarity, memory cells of the first deck 205-a and the second deck 205-b each may include one or more memory elements 220 (e.g., elements comprising a memory material configurable to store information), which may or may not be self-selecting memory elements. Although some elements included in FIG. 2 are labeled with a numeric indicator, other corresponding elements are not labeled, though they are the same or would be understood to be similar, in an effort to increase visibility and clarity of the depicted features.

Memory cells of the first deck 205-a may include first electrode 225-a, a memory element 220-a, and a second electrode 225-b. In addition, memory cells of the second deck 205-b may include a first electrode 225-c, a memory element 220-b, and a second electrode 225-d. The memory cells of the first deck 205-a and second deck 205-b may, in some examples, have common conductive lines such that corresponding memory cells of each deck 205-a and 205-b may share bit lines 215 or word lines 210 as described with reference to FIG. 1. For example, first electrode 225-c of the second deck 205-b and the second electrode 225-b of the first deck 205-a may be coupled to bit line 215-a such that bit line 215-a is shared by vertically adjacent memory cells.

In some examples, the memory element 220 may, for example, comprise a chalcogenide material or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some other examples, a SAG-alloy may also contain indium (In), and such chalcogenide material may in some cases be referred to as InSAG-alloy. In some examples, a chalcogenide may include additional elements such as hydrogen (H), oxygen (O), nitrogen (N), chlorine (Cl), or fluorine (F), each in atomic or molecular forms.

In some cases, a memory element 220 may be included in a PCM cell and may change between crystalline and amorphous states. A memory element 220 in the crystalline state may have atoms arranged in a periodic structure, which may result in a relatively low electrical resistance (e.g., set state). By contrast, a memory element 220 in an amorphous state may have no or relatively little periodic atomic structure, which may have a relatively high electrical resistance (e.g., reset state). The difference in resistance values between amorphous and crystalline states of the memory element 220 may be significant; for example, a material in an amorphous state may have a resistance one or more orders of magnitude greater than the resistance of the material in its crystalline state. In some cases, the amorphous state may have a threshold voltage associated with it and current may not flow until Vth is exceeded. In other cases, a memory element 220 may be partially amorphous and partially crystalline, and the resistance may be of some value between the resistances of the memory element 220 in a wholly crystalline or wholly amorphous state. A memory element 220 thus may be used for other than binary logic applications—i.e., the number of possible states stored in a material may be more than two.

A memory element 220 may be switched from amorphous to crystalline and vice versa and thus a state may be written to the memory cell that includes the memory element 220—by applying a voltage across and thus passing current through the memory element 220 so as to heat the memory element 220 beyond a melting temperature, and then removing the voltage and current according to various timing parameters configured to render the memory element 220 in the desired state (e.g., amorphous or crystalline). Heating and quenching of the memory element 220 may be accomplished by controlling current flow through the memory element 220, which in turn may be accomplished by controlling the voltage differential between the corresponding word line 210 and corresponding bit line 215.

In some cases, a memory element 220 included in a self-selecting memory cell may be operated so as to not undergo a phase change during normal operation of the memory cell (e.g., due to the composition of the memory (e.g., chalcogenide) material, and/or due to operational voltages and currents configured to maintain the memory element 220 in a single phase, such as an amorphous or glass phase). For example, the memory element 220 may include a chemical element, such as arsenic, that inhibits crystallization of a chalcogenide material and thus may remain in an amorphous state. Here, some or all of the set of logic states supported by the memory cells (e.g., including memory element 220 and electrodes 225) may be associated with an amorphous state of the memory element 220 (e.g., stored by the memory element 220 while the memory element 220 is in the amorphous state). For example, a logic state '0' and a logic state '1' may both be associated with an amorphous state of the memory element 220 (e.g., stored by the memory element 220 while the memory element 220 is in the amorphous state). In some cases, memory element 220 may be configured to store a logic state corresponding to an information bit.

During a programming (write) operation of a memory cell (e.g., including electrodes 225 a, memory element 220 a, and electrode 225 b), the polarity used for programming (writing) or whether the memory element 220 is programmed into an amorphous or crystalline state may influence (determine, set, program) a particular behavior or characteristic of the memory element 220, such as the threshold voltage of the memory element 220. The difference in threshold voltages of the memory element 220 depending on the logic state stored by the memory element 220 (e.g., the difference between the threshold voltage when the memory element 220 is storing a logic state '0' versus a logic state '1') may correspond to the read window of the memory element 220.

The architecture of memory array 200 may in some cases be referred to as a cross-point architecture, in which a memory cell is formed at a topological cross-point between a word line and a bit line as illustrated in FIG. 2. Such a cross-point architecture may offer relatively high-density data storage with lower production costs compared to at least some other memory architectures. For example, the cross-point architecture may have memory cells with a reduced area and, resultantly, an increased memory cell density compared to other architectures.

The memory array 200 may be configured to support a socket design for a memory device that achieves a desirable ED (e.g., 3 K, 4 K, etc.) for each memory cell in the memory array 200. For example, each word line 210 and bit line 215 may be coupled with a corresponding socket (not shown in FIG. 2), and the word line sockets and the bit line sockets may be located such that the ED associated with each memory cell in the memory array 200 is the same or similar. This may be achieved, for example, by arranging the rows of bit line sockets and the rows of word line sockets such that the rows of sockets may extend in a direction that is skew (i.e., not orthogonal) to the word lines 210 or the bit lines 215. In some cases, the rows of bit line sockets may be parallel to the rows of word line sockets.

FIGS. 3A, 3B, and 3C illustrate examples of socket designs 300 for cross-point memory in accordance with examples as disclosed herein. In some cases, the socket designs 300 may be incorporated in a memory array 102 as described with reference to FIG. 1 or a memory array 200 as described with reference to FIG. 2. The socket designs 300 may also include memory cells 305, word lines 310, and bit lines 315, which may be examples of a memory cell 105, a word line 110, and a bit line 115, as described with reference to FIG. 1.

Each row of memory cells 305 may be coupled with a corresponding word line 310, and each column of memory cells 305 may be coupled with a corresponding bit line 315. The word lines 310 may extend in a first direction, which may correspond to an x direction. The bit lines 315 may extend in a second direction, which may correspond to a y direction orthogonal to the x direction. Each word line 310 may be coupled with a word line socket in a word line socket region 320, and each bit line 315 may be coupled with a bit line socket in a bit line socket region 325. A word line socket may be coupled with an end (rather than, e.g., a midpoint) of a corresponding word line 310, and a bit line socket may be coupled with an end (rather than, e.g., a midpoint) of a corresponding bit line 315.

The word line sockets in the word line socket regions 320 may be organized in rows, which may be parallel to the longer edges of the word line socket regions 320. Similarly, the bit line sockets in the bit line socket regions 325 may be organized in rows, which may be parallel to the longer edges of the bit line socket regions 325. Each socket region 320, 325 may include any number of rows of sockets. As shown in FIG. 3, the longer edges of the bit line socket regions 325 may be parallel to the longer edges of the word line socket regions 320, and the rows of bit line sockets may be parallel to the rows of word line sockets. Additionally, the rows of bit line sockets and the rows of word line sockets may be skew (i.e., not orthogonal) and non-parallel to the word lines 310 and the bit lines 315.

The word line sockets in the word line socket regions 320 may couple the word lines 310 with vias that extend below the plane of the word lines 310 and the bit lines 315. That is, the vias may extend in a third direction, which may correspond to a z direction that is orthogonal to the x direction and the y direction. Similarly, the bit line sockets in the bit line socket regions 325 may couple the bit lines 315 with vias that extend below the plane of the word lines 310 and the bit lines 315. The vias may be coupled with circuitry (e.g., word line drivers or bit line drivers) that is below the plane of the word lines 310 and the bit lines 315.

As illustrated in FIG. 3A, the word lines 310-*a* through 310-*d* may each be coupled with a word line socket in one of word line socket regions 320-*a* and 320-*b* and may extend in the x direction away from the word line socket regions 320-*a* and 320-*b* and toward bit line socket regions 325-*a* and 325-*b*. The word lines 310-*a* through 310-*d* may end before reaching bit line socket regions 325-*a* and 325-*b*. Similarly, the bit lines 315-*a* through 315-*d* may each be coupled with a bit line socket in one of bit line socket regions 325-*a* and 325-*b* extend in the y direction away the bit line socket regions 325-*a* and 325-*b* and toward word line socket regions 320-*c* and 320-*d*. The bit lines 315-*a* through 315-*d* may end before reaching word line socket regions 320-*c* and 320-*d*.

Memory cells 305-*a* through 305-*j* may be located at intersections of the word lines 310 and the bit lines 315. For example, the memory cell 305-*a* may be located at the intersection of the word line 310-*d* and the bit line 315-*a*. Based on the socket design 300-*a*, each memory cell 305 (e.g., each of the memory cells 305-*a* through 305-*j*) may have a same or similar associated ED (e.g., combined $R_W$ and $R_{BL}$). In a first example, the memory cell 305-*a* may be located relatively near the word line socket of the word line 310-*d* in the word line socket region 320-*b* and relatively far from the bit line socket of the bit line 315-*a* in the bit line socket region 325-*a*. Accordingly, a corresponding word line resistance $R_{WL,305\text{-}a}$ for the memory cell 305-*a* may be small, and a corresponding bit line resistance $R_{BL,305\text{-}a}$ may be large. In a second example, the memory cell 305-*d* may be located relatively far from the word line socket of the word line 310-*d* in the word line socket region 320-*b* and relatively near the bit line socket of the bit line 315-*ad* in the bit line socket region 325-*d*. Accordingly, a corresponding word line resistance $R_{WL,305\text{-}d}$ for the memory cell 305-*d* may be large, and a corresponding bit line resistance $R_{BL,305\text{-}d}$ may be small. In both examples, however, the sum of the word line resistance and the bit line resistance may be the same, as $R_{WL,305\text{-}a}+R_{BL,305\text{-}a}=R_{WL,305\text{-}d}+R_{BL,305\text{-}d}$, or similar. That is, the ED for the memory cell 305-*a* may be the same or similar as the ED for the memory cell 305-*d*. By extension, the ED for each of the memory cells 305-*a* through 305-*j* may be the same or similar.

In the socket design 300-*b* illustrated in FIG. 3B, a word line 310-*e* may extend in the x direction away front word line socket region 320-*e* and toward bit line socket region 325-*c*. The word line 310-*e* may end before reaching bit line socket region 325-*c*. Similarly, a bit line 315-*e* may extend in they direction away from bit line socket region 325-*c* and toward word line socket region 320-*e*, and the bit line 315-*e* may end before reaching the word line socket region 320-*e*. A memory cell 305-*k* may be located at the intersection of the word line 310-*e* and the bit line 315-*e*.

In the example of FIG. 3B, the word line 310-*e* and the bit line 315-*e* may have the same resistivity ρ. In some examples, the word line 310-*e* and the bit line 315-*e* may be composed of the same material. In some other examples, the word line 310-*e* and the bit line 315-*e* may be composed of different materials, and the memory device may be manufactured or processed (e.g., such that word lines 310 and bit lines 315 have different cross-sectional areas, such as different thicknesses) such that the word line 310-*e* and the bit line 315-*e* have the same resistivity ρ. The word line socket region 320-*e* and the bit line socket region 325-*c* may both be tilted at an angle 330-*a* relative to the x direction, which may be 45°.

Based on the socket design 300-*b*, each memory cell 305 (e.g., the memory cell 305-*k*) may have a same associated ED. That is, the sum $R_{WL}+R_{BL}$ of the word line resistance and the bit line resistance may be the same for each memory cell 305. For example, the memory cell 305-*k* may be located a distance 335-*a* from the bit line socket in the bit line socket region 325-*c* along the bit line 315-*e*. The distance 335-*a* may be referred to as $L_{BL}$. Additionally, the memory cell 305-*k* may be located a distance 335-*b* from the word line socket in the word line socket region 320-*e* along the word line 310-*e*. The distance 335-*b* may be referred to as $L_{WL}$. Because the word lines 310 and the bit line 315 in the socket design 300-*b* have the same resistivity ρ, the sum of the corresponding word line distance and the corresponding bit line distance for each memory cell 305 in the socket design 300-*b* may be the same ($L_{WL}+L_{BL}$). That is, an increased or decreased distance 335-*a* from the corresponding bit line socket to a memory cell 305 may be compensated by a decreased or increased distance 335-*b* from the corresponding word line socket to the memory cell 305 such that each memory cell 305 has the same associated ED.

In the socket design 300-*c* illustrated in FIG. 3C, a word line 310-*f* may extend in the x direction away from word line socket region 320-*f* and toward bit line socket region 325-*d*. The word line 310-*f* may end before reaching bit line socket region 325-*d* and have a length B. Similarly, a bit line 315-*f* may extend in the y direction away from bit line socket region 325-*d* and toward word line socket region 320-*f*. The bit line 315-*f* may end before reaching word line socket region 320-*f* and have a length H. A memory cell 305-*l* may be located at the intersection of the word line 310-*f* and the bit line 315-*f*. The memory cell 305-*l* may be located a distance 335-*d* from the bit line socket in the bit line socket region 325-*d* along the bit line 315-*f*. The distance 335-*d* may also be referred to as h. Additionally, the memory cell 305-*k* may be located a distance 335-*c* from the word line socket in the word line socket region 320-*f* along the word line 310-*f*. The distance 335-*c* may also be referred to as b.

In the example of FIG. 3C, the word line 310-*f* and the bit line 315-*f* may have different resistivities. For example, the word line 310-*f* may have a resistivity $\rho_W$, and the bit line 315-*f* may have a resistivity $\rho_B$. In some examples, the word line 310-*f* and the bit line 315-*f* may be composed of different materials. In some other examples, the word line 310-*f* and the bit line 315-*f* may be composed of the same material, and the memory device may be manufactured or processed (e.g., such that word lines 310 and bit lines 315 have different cross-sectional areas, such as different thicknesses) such that the word line 310-*f* and the bit line 315-*f* have the respective resistivities $\rho_W$ and $\rho_B$. The word line socket region 320-*f* and the bit line socket region 325-*d* may be tilted at an angle 330-*b* relative to the x direction, which may not be 45°. The angle 330-*b* may also be referred to as θ, where H/B=tan(θ). Additionally, the angle θ may be expressed as tan(θ)=h/(B−b).

Based on the socket design 300-*c*, each memory cell 305 (e.g., the memory cell 305-*l*) may have a same associated ED. That is, the sum $R_{WL}R_{BL}$, of the word line resistance and the bit line resistance may be the same or similar for each memory cell 305. In order for this sum to be the same or similar for each memory cell 305, a memory cell 305 at the furthest distance H from the bit line socket region 325-*d* and a memory cell 305 at the furthest distance B from the word line socket region 325-*f* may have the same or similar resistance; for example, $H \cdot \rho_B = B \cdot \rho_W$. This equality may be rewritten as $H/B = \rho_W/\rho_B$, where H/B=tan(θ).

For the memory cell 305-*l*, the sum $R_{WL}+R_{BL}$ may be expressed as $h \cdot \rho_B + b \cdot \rho_W$. By substitution, this sum may also be expressed as $(B-b) \cdot \tan(\theta) \cdot \rho_B + b \cdot \rho_W$. After rearranging, this sum may become $B \cdot \tan(\theta) \cdot \rho_B + b \cdot (\rho_W - \rho_B \tan(\theta))$, which is the same as $B \cdot \tan(\theta) \cdot \rho_B + b \cdot (\rho_W - \rho_W / \rho_B)$. The second term may be equal to 0, and the first term may be rewritten as $B \cdot \rho_W$ after a substitution. The resistance $B \cdot \rho_W$ may be a constant value independent of h and b, meaning the resistance $B \cdot \rho_W$ (or the equivalent resistance $H \cdot \rho_B$) may be the same for each memory cell 305 in the socket design 300-*c*. Accordingly, each memory cell 305 in the socket design 300-*c* may have the same or similar ED.

In each of the socket designs 300, because each memory cell 305 has the same or similar associated ED, a memory device may, for example, apply a same voltage $V_{source}$ and a same current I to achieve a same voltage drop $V_{cell}$ across any memory cell 305. This may enable the memory device to avoid large current discharge across near-near memory cells 305 due to parasitic capacitance of the word lines 310 or the bit lines 315 along with sufficient drive current for far-far memory cells 305, which may improve performance and increase the lifetimes of the memory cells 305, regardless of their physical location in a memory array. Additionally, the memory device may avoid any need to determine an appropriate voltage $V_{source}$ and an appropriate current I for different memory cells 305 at different physical locations, which may reduce a signaling overhead and associated latencies for access operations, among other benefits.

Figure 4A:
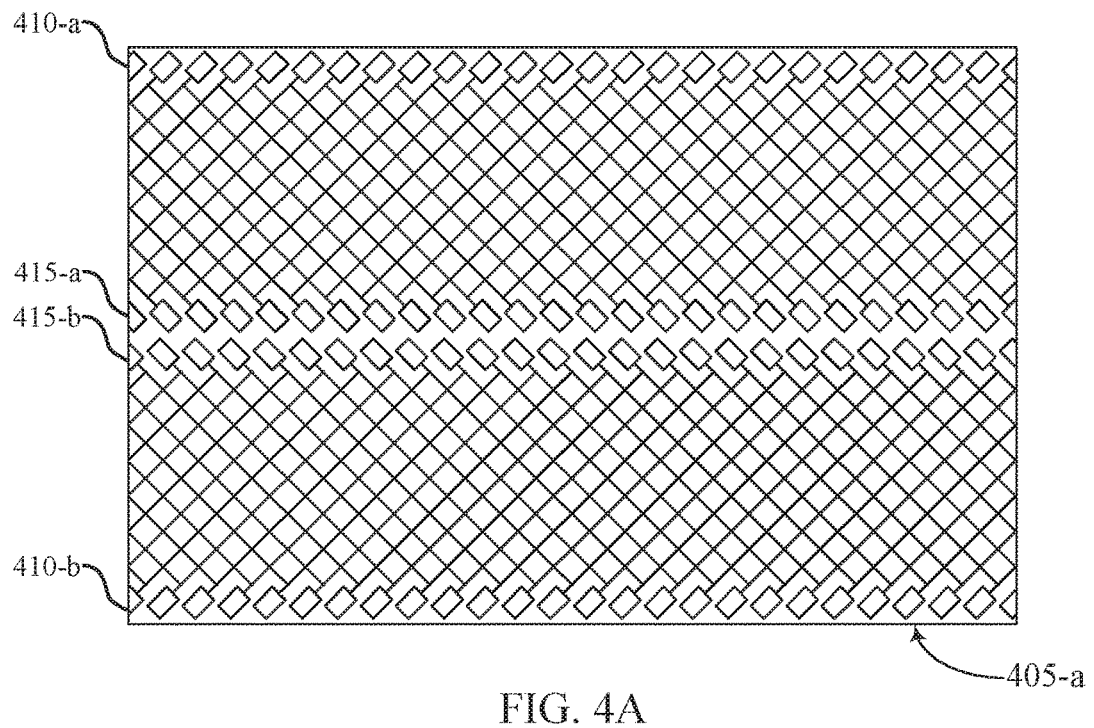
FIGS. 4A and 4B illustrate examples of a die layout that supports a socket design for a memory device in accordance with examples as disclosed herein.
Figure 4B:
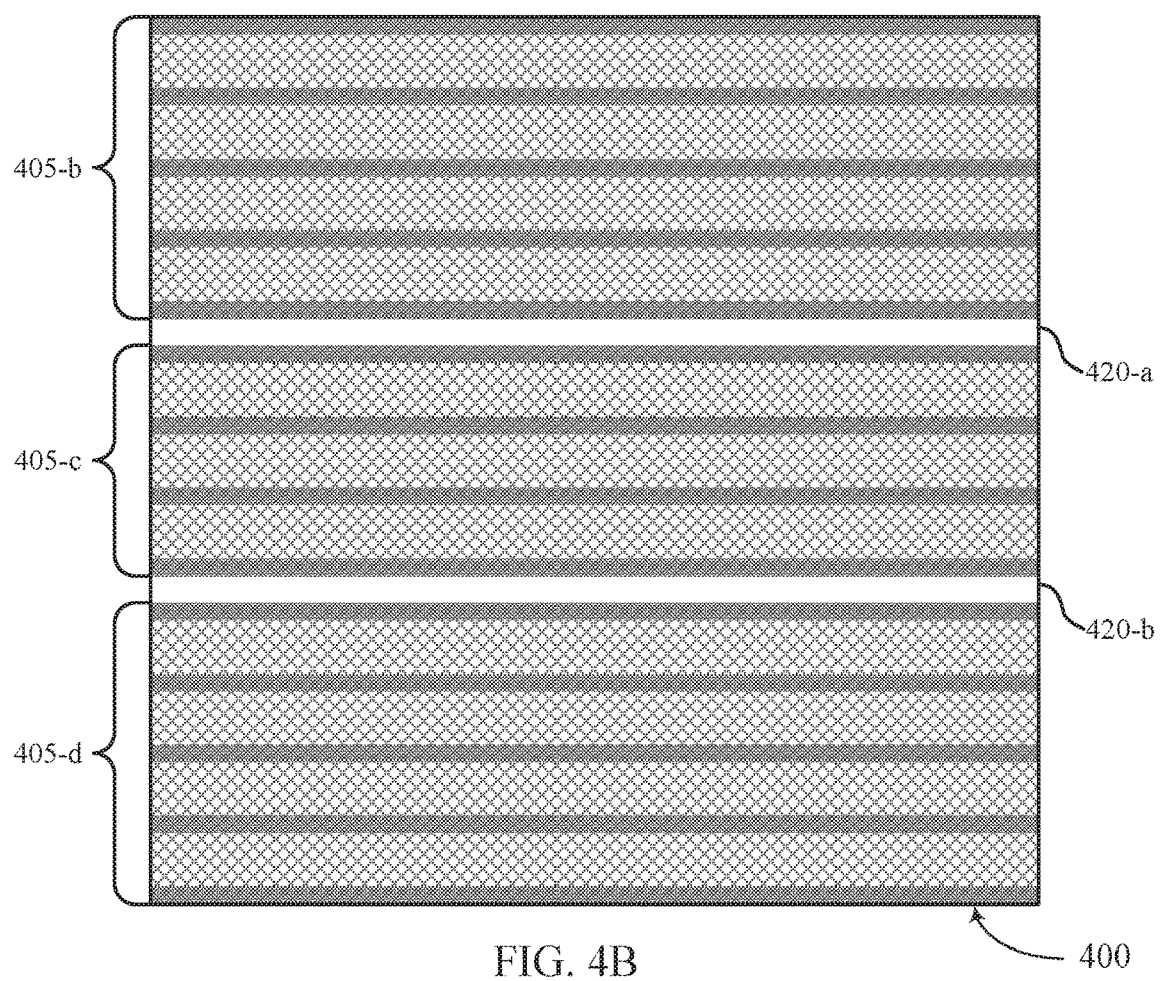

FIGS. 4A and 4B illustrate examples of a memory die 400 that supports a socket design for a memory device in accordance with examples as disclosed herein. The memory die 400 may include one or more memory arrays 405, which may each be an example of a memory array described with reference to FIG. 1, 2, or 3.

FIG. 4A illustrates an example of a memory array 405-*a*. The memory array 405-*a* may include word line socket rows 410 and bit line socket rows 415. Each word line socket in each word line socket row 410 may be coupled with a word line, which may be an example of a word line 110 as described with reference to FIG. 1. Similarly, each bit line socket in each bit line socket row 415 may be coupled with a bit line, which may be an example of a bit line 115 as described with reference to FIG. 1.

As illustrated in FIG. 4A, word lines may extend from the word line sockets in the word line socket rows 410, and bit lines may extend from the bit line sockets in the bit line socket rows 415. The word lines that extend from the word line sockets in the word line socket row 410-*a* may end before reaching the bit line socket row 415-*a*. Similarly, the bit lines that extend from the bit line sockets in the bit line socket row 415-*b* may end before reaching the word line socket row 410-*b*.

The word lines may be orthogonal to the bit lines. The word line socket rows 410 may be parallel to the bit line socket rows 415. The word line socket rows 410 and the bit line socket rows 415 may be skew (i.e., not orthogonal or parallel) to the word lines and the bit lines. Additionally, the word line socket rows 410 and the bit line socket rows 415 may be parallel to an edge of the memory array 405-*a*.

As illustrated in FIG. 4A, multiple bit line socket rows 415 (e.g., the bit line socket rows 415-*a* and 415-*b*) may be located between the consecutive word line socket rows 410-*a* and 410-*b*. Bit line socket rows 415-*a* and 415-*b* may be considered as included in a single bit line socket region, and word line socket rows 410-*a* and 410-*b* may be considered as included in distinct word line socket regions, and thus bit regions and word line regions may alternate, even if multiple rows of a given socket type are between rows of another socket type.

In some examples, such as in a multi-deck configuration, more than two socket rows of a given type may be located in a socket region, where a socket region may be considered a 3D space that includes overlaying 2D areas within different layers that include sockets. For example, within a single socket region, rows of sockets and vias coupled with access lines for one deck may be located between rows of sockets and vias couple with access lines for another deck.

FIG. 4B illustrates an example layout for a memory die 400. The memory die 400 may include multiple memory arrays 405-*b*, 405-*c*, and 405-*d*. Each memory array 405 may include word lines, bit lines, bit line socket rows 415, and word line socket rows 410 as described with reference to FIG. 4A or otherwise as described herein, where the socket rows 410, 415 may be grouped and/or included in corresponding socket regions. The word line socket rows 410 and the bit line socket rows 415 of a memory array 405 may be parallel to a first edge of the memory die 400. Additionally, the word line socket rows 410 and the bit line socket rows 415 of a memory array 405 may be perpendicular (orthogonal) to a second edge of the memory die 400. The word lines and bit lines may be skew (i.e., neither orthogonal nor parallel) to both the word line socket rows 410 and the bit line socket rows 415 along with at least two (in some cases all) edges of the memory die 400.

The memory die 400 may also include periphery areas 420 located between the memory arrays 405 (e.g., between socket regions associated with neighboring memory arrays 405). Additional circuitry (e.g., power buses) for operating a memory device may be located beneath the periphery areas 420.

Figure 5:
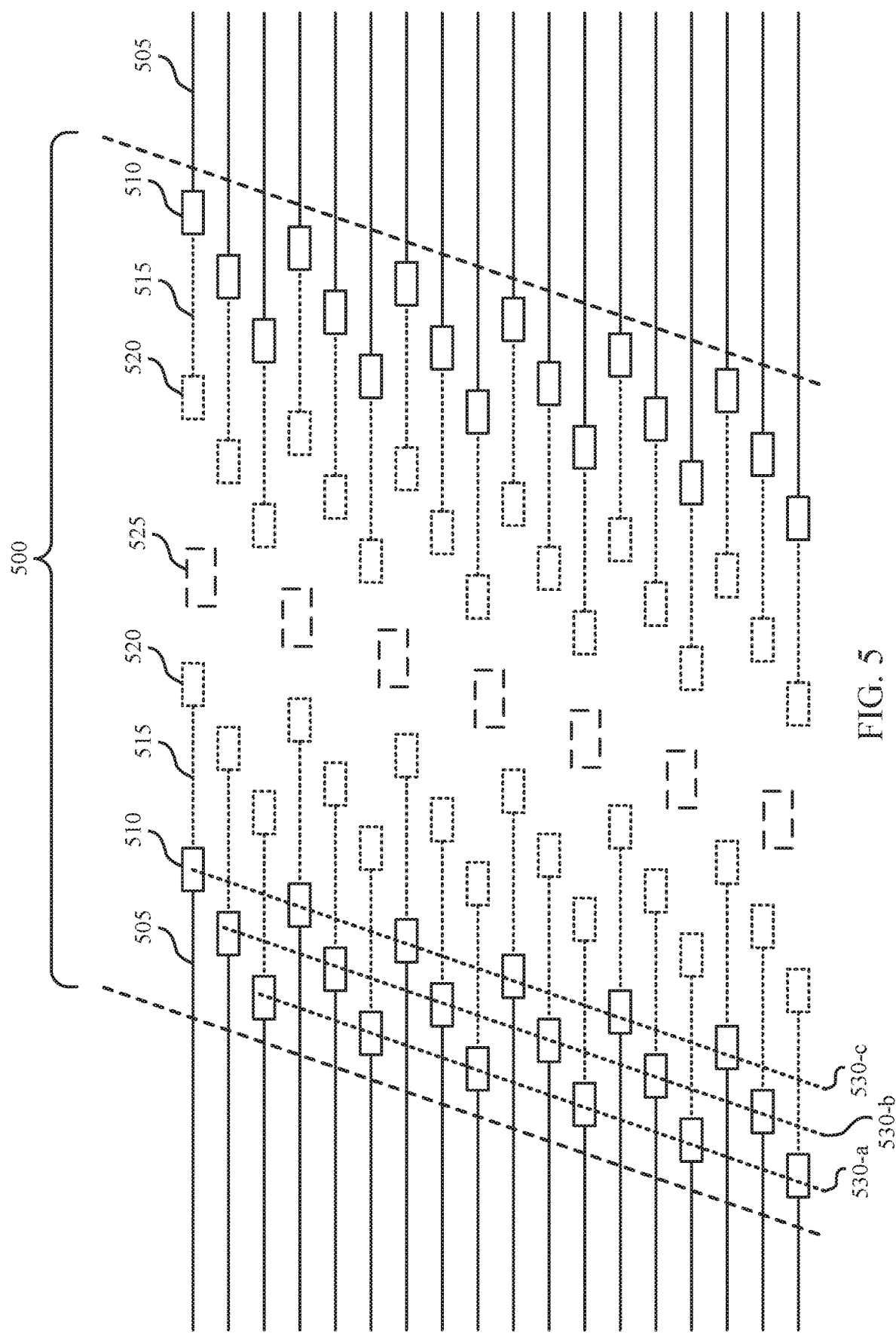
FIG. 5 illustrates an example of a socket region that supports a socket design for a memory device in accordance with examples as disclosed herein.

FIG. 5 illustrates an example of a socket region 500 that supports a socket design for a memory device in accordance with examples as disclosed herein. The socket region 500 may include sockets 510 of a first deck of a memory device, where each socket 510 may be coupled with an access line 505 of the first deck, which may be an example of a word line 110 or a bit line 115 described with reference to FIG. 1. The socket region 500 may also include sockets 520 of a second deck of the memory device, where each socket 520 may be coupled with an access line 515 of the second deck. The second deck may be located above or below the first deck. The socket region 500 may also include through vias (e.g., through-silicon vias (TSVs)) 525 that may pass through multiple decks, and potentially through the die that includes socket region 500. The access lines 505 and 515 may extend in a first direction, which may be the x direction or the y direction.

Each socket 510, 520 may couple an access line 505, 515 with a via that extends from the first deck or the second deck in the z direction. The vias may be coupled with circuitry (e.g., power buses, a memory controller, etc.) which may be located below the decks of the memory device. Because the vias may extend across all the decks of the memory device, one or more rows of sockets 520 for one deck may be between one or more rows of sockets 510 may be for another deck. Additionally, the sockets 510, 520 may be wide compared to the spacing of adjacent access lines 505, 515, and so the sockets 510 may be staggered in the first direction to allow for a greater density of access lines 505, 515 in each first deck. Staggered sockets 510, 520 may include parallel rows 530 of sockets 510, 520, where access lines 505, 515 coupled with sockets 510, 520 of one row 530 are separated by access lines 505, 515 coupled with sockets 510, 520 of one or more other rows 530.

FIG. 5 includes the sockets 510, 520 for the first and second decks, respectively. The socket region 500 may further include additional sockets (not shown) for any number of additional decks. As more sockets for additional decks are added to the socket region 500, the socket region 500 may become wider to ensure that the vias for the decks are separated (insulated) from one another.

Figure 6:
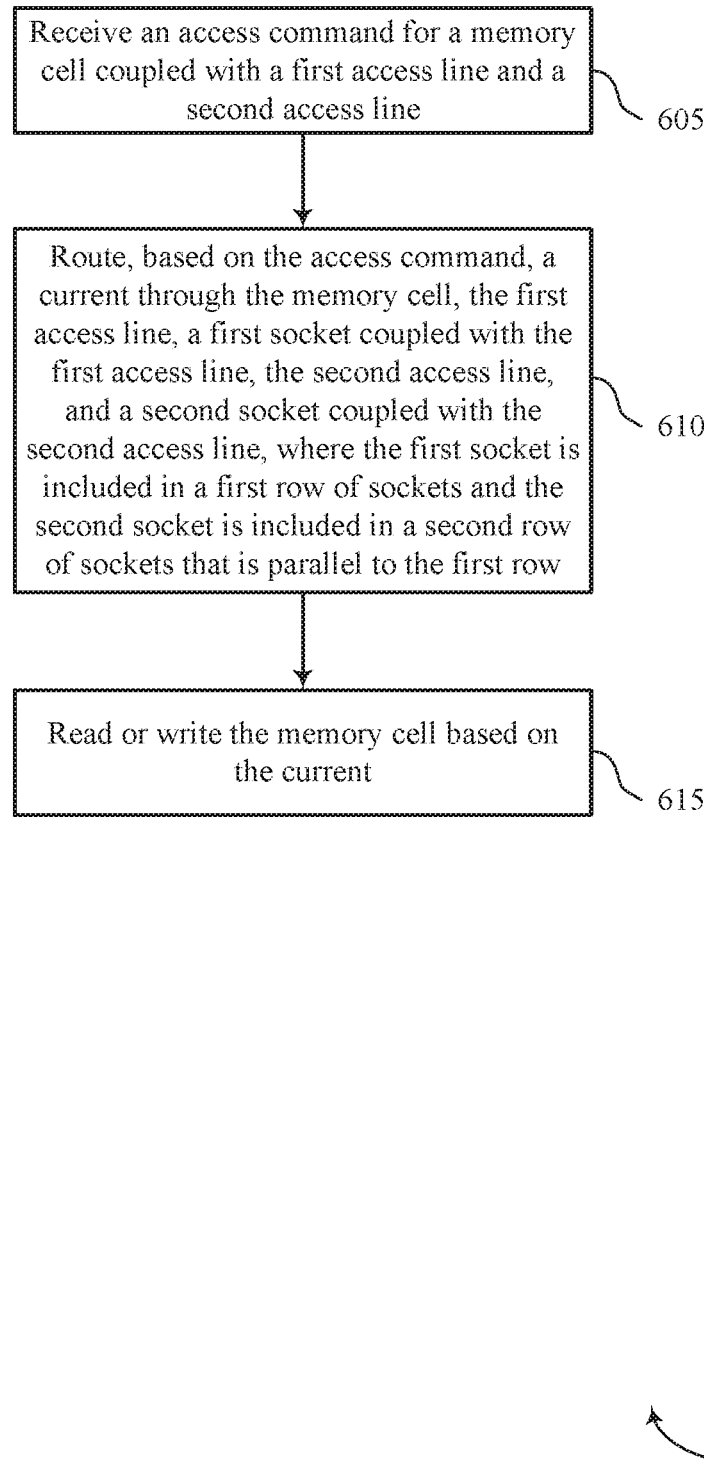
FIG. 6 shows a flowchart illustrating a method that supports a socket design for a memory device in accordance with examples as disclosed herein.

FIG. 6 shows a flowchart illustrating a method or methods 600 that supports a socket design for a memory device in accordance with examples as disclosed herein. The operations of method 600 may be implemented by a memory device or its components as described herein. For example, the operations of method 600 may be performed by a memory device as described with reference to FIG. 1. In some examples, a memory device may execute a set of instructions to control the functional elements of the memory device to perform the described functions. Additionally or alternatively, a memory device may perform examples of the described functions using special-purpose hardware.

At 605, the memory device may receive an access command for a memory cell coupled with a first access line and a second access line. The operations of 605 may be performed according to the methods described herein.

At 610, the memory device may route, based on the access command, a current through the memory cell, the first access line, a first socket coupled with the first access line, the second access line, and a second socket coupled with the second access line, where the first socket is included in a first row of sockets and the second socket is included in a second row of sockets that is parallel to the first row. The operations of 610 may be performed according to the methods described herein.

At 615, the memory device may read or write the memory cell based on the current. The operations of 615 may be performed according to the methods described herein.

In some examples, an apparatus as described herein may perform a method or methods, such as the method 600. The apparatus may include features, means, or instructions (e.g., a non-transitory computer-readable medium storing instructions executable by a processor) for receiving an access command for a memory cell coupled with a first access line and a second access line, routing, based on the access command, a current through the memory cell, the first access line, a first socket coupled with the first access line, the second access line, and a second socket coupled with the second access line, where the first socket is included in a first row of sockets and the second socket is included in a second row of sockets that is parallel to the first row, and reading or writing the memory cell based on the current.

In some examples of the method 600 and the apparatus described herein, the first row of sockets may be non-orthogonal to the first access line, and the second row of sockets may be non-orthogonal to the second access line.

In some examples of the method 600 and the apparatus described herein, the first row of sockets may be non-orthogonal to the second access line, and the second row of sockets may be non-orthogonal to the first access line.

It should be noted that the methods described above describe possible implementations, and that the operations and the steps may be rearranged or otherwise modified and that other implementations are possible. Further, portions from two or more of the methods may be combined.

An apparatus is described. The apparatus may include a set of first access lines for a memory array that extend in a first direction, a set of second access lines for the memory array that extend in a second direction, a set of first sockets each coupled with a respective first access line of the set and with a respective first driver of a set of first drivers, the set of first sockets arranged in a first row, and a set of second sockets each coupled with a respective second access line of the set and with a respective second driver of a set of second drivers, the set of second sockets arranged in a second row that is parallel to the first row.

In some examples, the first row and the second row both extend in a third direction, and the first direction and the second direction may be both non-parallel to the third direction.

In some examples, the first direction and the second direction may be both non-orthogonal to the third direction.

In some examples, the first direction and the second direction may be at a forty-five (45) degree angle relative to the third direction.

In some examples, the first access lines of the set and the second access lines of the set each include a same material.

Some examples may further include one of the first direction and the second direction may be at an acute angle relative to the third direction, and another of the first direction and the second direction may be at an obtuse angle relative to the third direction.

In some examples, the first access lines of the set each include a first material, and the second access lines of the set each include a second material.

In some examples, the first access lines of the set each may have a first resistivity, and the second access lines of the set each may have a second resistivity.

Some examples of the apparatus may include a set of vias, where the first sockets of the set and the second sockets of the set may be each coupled with the respective first driver or with the respective second driver by a respective via of the set, and where the vias of the set each extend in a fourth direction that may be orthogonal to the first direction, the second direction, and the third direction.

In some examples, the set of first access lines, the set of second access lines, the set of first sockets, and the set of second sockets may be included in a die having a first edge and a second edge, and the first row and the second row both extend in a third direction that may be parallel with the first edge or the second edge.

In some examples, the first direction may be non-parallel with the first edge and with the second edge, and the second direction may be non-parallel with the first edge and with the second edge.

Some examples of the apparatus may include a second set of first access lines that each extend in a first direction, a second set of first sockets each coupled with a respective first access line of the second set and with a respective first driver of a second set of first drivers, the second set of first sockets arranged in a third row, where a gap exists between the first row and the third row, and power distribution circuitry below the gap.

In some examples, each first socket of the set may be coupled with an end of a respective first access line of the set, and each second socket of the set may be coupled with an end of a respective second access line of the set.

In some examples, the first direction may be orthogonal to the second direction.

In some examples, each first access line of the set includes a word line, and each second access line of the set includes a bit line.

An apparatus is described. The apparatus may include a set of first access lines for a memory array that extend in a first direction, a set of second access lines for the memory array that extend in a second direction, a set of first sockets each coupled with a respective first access line of the set and with a respective first driver of a set of first drivers, the set of first sockets arranged in a first row that is skew to the first direction, and a set of second sockets each coupled with a respective second access line of the set and with a respective second driver of a set of second drivers, the set of second sockets arranged in a second row that is skew to the second direction.

In some examples, the first row and the second row may be non-parallel to the first direction and to the second direction.

In some examples, the first row may be parallel to the second row.

In some examples, the set of first access lines, the set of second access lines, the set of first sockets, and the set of second sockets may be included in a die having a first edge and a second edge, and the first direction and the second direction may be both non-parallel with the first edge.

In some examples, the first direction and the second direction may be both non-parallel with the second edge.

In some examples, the first row and the second row may be parallel with the first edge.

Some examples of the apparatus may include a set of vias that each extend in a fourth direction, where each via of the set couples a respective socket of the set of first sockets or the set of second sockets with a respective driver of the set of first drivers or the set of second drivers, and where the fourth direction may be orthogonal to the first direction, the second direction, and the third direction.

An apparatus is described. The apparatus may include a set of word lines for a set of memory cells, where each word line of the set extends in a first direction, a set of bit lines for the set of memory cells, where each bit line of the set extends in a second direction, a row of word line sockets, where each word line socket of the row is coupled with a corresponding word line of the set and a corresponding word line driver of a set of word line drivers, and a row of bit line sockets, where each bit line socket of the row is coupled with a corresponding bit line of the set and a corresponding bit line driver of a set of bit line drivers, and where the row of bit line sockets is parallel to the row of word line sockets.

Some examples of the apparatus may include a second set of word lines for a second set of memory cells, where each word line of the second set extends in the first direction, a second set of bit lines for the second set of memory cells, where each bit line of the second set extends in the second direction, a second row of word line sockets, where each word line socket of the second row may be coupled with a corresponding word line of the second set and a corresponding word line driver of a second set of word line drivers, a second row of bit line sockets, where each bit line socket of the second row may be coupled with a corresponding bit line of the set and a corresponding bit line driver of a second set of bit line drivers, where, and the row of word line sockets and the second row of word line sockets may be between the row of bit line sockets and the second row of bit line sockets.

In some examples, the second row of word line sockets and the second row of bit line sockets may be parallel to the row of word line sockets and the row of bit line sockets.

In some examples, the second row of word line sockets and the second row of bit line sockets may be non-orthogonal to the first direction and the second direction.

In some examples, each word line socket of the row may be coupled with an end of the corresponding word line of the set that may be furthest from the row of bit line sockets, and each word line socket of the second row may be coupled with an end of the corresponding word line of the second set that may be furthest from the second row of bit line sockets.

In some examples, the second row of word line sockets and the second row of bit line sockets may be non-orthogonal to the first direction and the second direction.

In some examples, the row of word line sockets and the row of bit line sockets may be non-orthogonal to the first direction and the second direction.

An apparatus is described. The apparatus may include word lines for an array of memory cells, where the word lines are each oriented in a first direction, bite lines for the array of memory cells, where the bit lines are each oriented in a second direction that is orthogonal to the first direction, vias oriented in a third direction that is orthogonal to the first direction and the second direction, where the vias are coupled with circuitry that is below the array of memory cells, a row of word line sockets, where the word line sockets couple the word lines with a first subset of the vias, and where the row of word line sockets is oriented in a fourth direction that is different than the first direction, different than the second direction, and different than the third direction, and a row of bit line sockets, where the bit line sockets couple the bit lines with a second subset of the vias, and where the row of bit line sockets is oriented in a fifth direction that is different than the first direction, different than the second direction, and different than the third direction.

In some examples, the fourth direction may be parallel to the fifth direction.

In some examples, the fourth direction may be non-orthogonal with the first direction, and the fifth direction may be non-orthogonal with the second direction.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" used herein refers to a stratum or sheet of a geometrical structure. Each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily doped, e.g., degenerate, semiconductor region. The source and drain may be separated by a lightly doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding, of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a set of first access lines for a memory array that extend in a first direction;
   a set of second access lines for the memory array that extend in a second direction;
   a set of first sockets each coupled with an end of a respective first access line of the set and with a respective first driver of a set of first drivers, the set of first sockets arranged in a first row; and
   a set of second sockets each coupled with an end of a respective second access line of the set and with a respective second driver of a set of second drivers, the set of second sockets arranged in a second row that is parallel to the first row.

2. An apparatus, comprising:
   a set of first access lines for a memory array that extend in a first direction;
   a set of second access lines for the memory array that extend in a second direction;
   a set of first sockets each coupled with a respective first access line of the set and with a respective first driver of a set of first drivers, the set of first sockets arranged in a first row; and
   a set of second sockets each coupled with a respective second access line of the set and with a respective second driver of a set of second drivers, the set of second sockets arranged in a second row that is parallel to the first row, wherein the first row and the second row both extend in a third direction, and wherein the first direction and the second direction are both non-parallel to the third direction.

3. The apparatus of claim 2, wherein the first direction and the second direction are both non-orthogonal to the third direction.

4. The apparatus of claim 2, wherein the first direction and the second direction are at a forty-five (45) degree angle relative to the third direction.

5. The apparatus of claim 4, wherein the first access lines of the set and the second access lines of the set each comprise a same material.

6. The apparatus of claim 2, wherein:
   one of the first direction and the second direction is at an acute angle relative to the third direction; and
   another of the first direction and the second direction is at an obtuse angle relative to the third direction.

7. The apparatus of claim 6, wherein:
   the first access lines of the set each comprise a first material; and
   the second access lines of the set each comprise a second material.

8. The apparatus of claim 6, wherein:
   the first access lines of the set each have a first resistivity; and
   the second access lines of the set each have a second resistivity.

9. The apparatus of claim 2, wherein the set of first drivers and the set of second drivers are below the memory array, further comprising:
   a plurality of vias, wherein the first sockets of the set and the second sockets of the set are each coupled with the respective first driver or with the respective second driver by a respective via of the plurality, and wherein the vias of the plurality each extend in a fourth direction that is orthogonal to the first direction, the second direction, and the third direction.

10. An apparatus, comprising:
    a set of first access lines for a memory array that extend in a first direction;
    a set of second access lines for the memory array that extend in a second direction;
    a set of first sockets each coupled with a respective first access line of the set and with a respective first driver of a set of first drivers, the set of first sockets arranged in a first row; and
    a set of second sockets each coupled with a respective second access line of the set and with a respective second driver of a set of second drivers, the set of second sockets arranged in a second row that is parallel to the first row, wherein:
the set of first access lines, the set of second access lines, the set of first sockets, and the set of second sockets are included in a die having a first edge and a second edge; and
the first row and the second row both extend in a third direction that is parallel with the first edge or the second edge.

11. The apparatus of claim 10, wherein:
the first direction is non-parallel with the first edge and with the second edge; and
the second direction is non-parallel with the first edge and with the second edge.

12. An apparatus, comprising:
a first set of first access lines for a memory array that extend in a first direction;
a first set of second access lines for the memory array that extend in a second direction;
a first set of first sockets each coupled with a respective first access line of the first set of first access lines and with a respective first driver of a set of first drivers, the first set of first sockets arranged in a first row; and
a first set of second sockets each coupled with a respective second access line of the first set of second access lines and with a respective second driver of a set of second drivers, the set of second sockets arranged in a second row that is parallel to the first row:
a second set of first access lines that each extend in the first direction;
a second set of first sockets each coupled with a respective first access line of the second set of first access lines and with a respective first driver of a second set of first drivers, the second set of first sockets arranged in a third row, wherein a gap exists between the first row and the third row; and
power distribution circuitry below the gap.

13. The apparatus of claim 1, wherein the first direction is orthogonal to the second direction.

14. The apparatus of claim 1, wherein:
each first access line of the set comprises a word line; and
each second access line of the set comprises a bit line.

15. An apparatus, comprising:
a set of first access lines for a memory array that extend in a first direction;
a set of second access lines for the memory array that extend in a second direction;
a set of first sockets each coupled with a respective first access line of the set and with a respective first driver of a set of first drivers, the set of first sockets arranged in a first row that is skew to the first direction; and
a set of second sockets each coupled with a respective second access line of the set and with a respective second driver of a set of second drivers, the set of second sockets arranged in a second row that is skew to the second direction, wherein the set of first access lines, the set of second access lines, the set of first sockets, and the set of second sockets are included in a die having a first edge and a second edge, and wherein the first direction and the second direction are both non-parallel with the first edge.

16. The apparatus of claim 15, wherein the first row and the second row are non-parallel to the first direction and to the second direction.

17. The apparatus of claim 15, wherein the first row is parallel to the second row.

18. The apparatus of claim 15, wherein the first direction and the second direction are both non-parallel with the second edge.

19. The apparatus of claim 18, wherein the first row and the second row are parallel with the first edge.

20. An apparatus, comprising:
a set of first access lines for a memory array that extend in a first direction;
a set of second access lines for the memory array that extend in a second direction;
a set of first sockets each coupled with a respective first access line of the set and with a respective first driver of a set of first drivers, the set of first sockets arranged in a first row that is skew to the first direction; and
a set of second sockets each coupled with a respective second access line of the set and with a respective second driver of a set of second drivers, the set of second sockets arranged in a second row that is skew to the second direction, wherein the set of first drivers and the set of second drivers are below the set of the first sockets and the set of second sockets; and
a plurality of vias that each extend in a fourth direction, wherein each via of the plurality couples a respective socket of the set of first sockets or the set of second sockets with a respective driver of the set of first drivers or the set of second drivers, and wherein the fourth direction is orthogonal to the first direction, the second direction, and a third direction.

21. An apparatus, comprising:
a first set of word lines for a first set of memory cells, wherein each word line of the first set extends in a first direction;
a second set of word lines for a second set of memory cells, wherein each word line of the second set extends in the first direction;
a first set of bit lines for the first set of memory cells, wherein each bit line of the first set extends in a second direction;
a second set of bit lines for the second set of memory cells, wherein each bit line of the second set extends in the second direction;
a first row of word line sockets, wherein each word line socket of the first row is coupled with a corresponding word line of the first set and a corresponding word line driver of a first set of word line drivers;
a second row of word line sockets, wherein each word line socket of the second row is coupled with a corresponding word line of the second set and a corresponding word line driver of a second set of word line drivers;
a first row of bit line sockets, wherein each bit line socket of the first row is coupled with a corresponding bit line of the first set and a corresponding bit line driver of a first set of bit line drivers, and wherein the first row of bit line sockets is parallel to the first row of word line sockets; and
a second row of bit line sockets, wherein each bit line socket of the second row is coupled with a corresponding bit line of the first set and a corresponding bit line driver of a second set of bit line drivers, and wherein the first row of word line sockets and the second row of word line sockets are between the first row of bit line sockets and the second row of bit line sockets.

22. The apparatus of claim 21, wherein:
the second row of word line sockets and the second row of bit line sockets are parallel to the first row of word line sockets and the first row of bit line sockets.

23. The apparatus of claim 21, wherein:
the second row of word line sockets and the second row of bit line sockets are non-orthogonal to the first direction and the second direction.

24. The apparatus of claim 21, wherein:
each word line socket of the first row is coupled with an end of the corresponding word line of the set that is furthest from the first row of bit line sockets; and
each word line socket of the second row is coupled with an end of the corresponding word line of the second set that is furthest from the second row of bit line sockets.

25. The apparatus of claim 21, wherein:
the second row of word line sockets and the second row of bit line sockets are non-orthogonal to the first direction and the second direction.

26. The apparatus of claim 21, wherein:
the first row of word line sockets and the first row of bit line sockets are non-orthogonal to the first direction and the second direction.

27. An apparatus, comprising:
word lines for an array of memory cells, wherein the word lines are each oriented in a first direction;
bit lines for the array of memory cells, wherein the bit lines are each oriented in a second direction that is orthogonal to the first direction;
vias oriented in a third direction that is orthogonal to the first direction and the second direction, wherein the vias are coupled with circuitry that is below the array of memory cells;
a row of word line sockets, wherein the word line sockets couple the word lines with a first subset of the vias, and wherein the row of word line sockets is oriented in a fourth direction that is different than the first direction, different than the second direction, and different than the third direction; and
a row of bit line sockets, wherein the bit line sockets couple the bit lines with a second subset of the vias, and wherein the row of bit line sockets is oriented in a fifth direction that is different than the first direction, different than the second direction, and different than the third direction.

28. The apparatus of claim 27, wherein the fourth direction is parallel to the fifth direction.

29. The apparatus of claim 27, wherein:
the fourth direction is non-orthogonal with the first direction; and
the fifth direction is non-orthogonal with the second direction.

* * * * *